US012648447B2

(12) United States Patent
Yu et al.

(10) Patent No.: US 12,648,447 B2
(45) Date of Patent: Jun. 2, 2026

(54) CHIP PACKAGE WITH ELECTROMAGNETIC INTERFERENCE (EMI) SHIELDING LAYER AND GROUND WIRE AND METHOD OF MANUFACTURING THE SAME

(71) Applicant: WALTON ADVANCED ENGINEERING, INC., Kaohsiung (TW)

(72) Inventors: Hong-Chi Yu, Kaohsiung (TW); Chun-Jung Lin, Kaohsiung (TW); Ruei-Ting Gu, Kaohsiung (TW)

(73) Assignee: WALTON ADVANCED ENGINEERING, INC., Kaohsiung (TW)

( * ) Notice: Subject to any disclaimer, the term of this patent is extended or adjusted under 35 U.S.C. 154(b) by 365 days.

(21) Appl. No.: 18/242,506

(22) Filed: Sep. 5, 2023

(65) Prior Publication Data

US 2024/0088057 A1     Mar. 14, 2024

(30) Foreign Application Priority Data

Sep. 8, 2022     (TW) ................................. 111134033

(51) Int. Cl.
| | |
|---|---|
| *H01L 23/552* | (2006.01) |
| *H01L 23/31* | (2006.01) |
| *H10W 42/20* | (2026.01) |
| *H10W 74/10* | (2026.01) |

(52) U.S. Cl.
CPC .......... *H10W 42/20* (2026.01); *H10W 74/117* (2026.01)

(58) Field of Classification Search
CPC ........... H01L 23/552; H01L 2924/3025; H01L 23/3128; H01L 23/49816; H01L 23/49838; H10W 42/20; H10W 74/117
USPC ........................................................ 257/659
See application file for complete search history.

(56) References Cited

U.S. PATENT DOCUMENTS

| | | | | | |
|---|---|---|---|---|---|
| 2008/0303120 | A1* | 12/2008 | Lee | ........................ | H01L 23/552 |
| | | | | | 257/659 |
| 2010/0230789 | A1* | 9/2010 | Yorita | ..................... | H01L 23/66 |
| | | | | | 257/659 |
| 2012/0025356 | A1* | 2/2012 | Liao | ........................ | H01L 24/97 |
| | | | | | 257/659 |
| 2015/0070851 | A1* | 3/2015 | Kitazaki | ............... | H01L 21/561 |
| | | | | | 29/841 |
| 2017/0118875 | A1* | 4/2017 | Kumbhat | .............. | H01L 23/552 |

(Continued)

*Primary Examiner* — Didarul A Mazumder
(74) *Attorney, Agent, or Firm* — Fei-hung Yang

(57)          ABSTRACT

A chip package with at least one electromagnetic interference (EMI) shielding layer and at least one ground wire and a method of manufacturing the same are provided. The chip package includes a chip package unit, at least one EMI shielding layer, and at least one ground wire. The ground wire which consists of a first end and a second end opposite to the first end is inserted through the EMI shielding layer and a first insulating layer of the chip package unit. The first end is electrically connected with the EMI shielding layer while the second end of the ground wire is electrically connected with at least one grounding end of at least one first circuit layer of the chip package unit for protection against static electricity. Thereby malfunction of an electronic system with semiconductor chips due to static electricity can be avoided.

8 Claims, 10 Drawing Sheets

(56) References Cited

U.S. PATENT DOCUMENTS

2017/0118877 A1\*  4/2017  Kumbhat ................ H01L 24/97
2022/0084963 A1\*  3/2022  Wei ..................... H01L 23/3677

\* cited by examiner

CHIP PACKAGE WITH ELECTROMAGNETIC INTERFERENCE (EMI) SHIELDING LAYER AND GROUND WIRE AND METHOD OF MANUFACTURING THE SAME

CROSS-REFERENCE TO RELATED APPLICATIONS

This non-provisional application claims priority under 35 U.S.C. § 119(a) on Patent Application No(s). 111134033 filed in Taiwan, R.O.C. on Sep. 8, 2022, the entire contents of which are hereby incorporated by reference.

BACKGROUND OF THE INVENTION

The present invention relates to a chip package and a method of manufacturing the same, especially to a chip package having at least one electromagnetic interference (EMI) shielding layer and at least one ground wire and a method of manufacturing the same.

In a field of semiconductor chip, However, while in use, static electricity or electromagnetic interference (EMI) may affect operation of an electronic system such as temporary malfunction of the electronic system, or even direct damages to the electronic system. Thus there is room for improvement and there is a need to provide a chip package with protective structure for prevention of static electricity or electromagnetic interference.

SUMMARY OF THE INVENTION

Therefore, it is primary object of the present invention to provide a chip package with at least one electromagnetic interference (EMI) shielding layer and at least one ground wire and a method of manufacturing the same. The chip package includes a chip package unit, at least one electromagnetic interference (EMI) shielding layer, and at least one ground wire. The ground wire which includes a first end and a second end opposite to each other is inserted through the EMI shielding layer and a first insulating layer of the chip package unit. The first end is electrically connected with the EMI shielding layer while the second end is electrically connected with at least one grounding end of at least one first circuit layer of the chip package unit for protection against static electricity. Thereby malfunction or failure of the electronic system with semiconductor chips caused by static electricity can be avoided.

In order to achieve the above object, a chip package with at least one electromagnetic interference (EMI) shielding layer and at least one ground wire according to the present invention is provided. The chip package includes a chip package unit, at least one electromagnetic interference (EMI) shielding layer, and at least one ground wire. The chip package unit consists of a substrate, at least one first circuit layer, at least one chip, and a first insulating layer. The first circuit layer is provided with at least one grounding end and the chip is electrically connected with and arranged at the first circuit layer of the substrate. The first insulating layer which is provided with a first surface is disposed on the substrate and covering the chip. The EMI shielding layer made of metals is covering and disposed on the first surface of the first insulating layer for protecting the chip package unit from electromagnetic interference (EMI). The ground wire which is inserted through the EMI shielding layer and the first insulating layer is provided with a first end and a second end opposite to the first end. The first end of the ground wire is electrically connected with the EMI shielding layer while the second end of the ground wire is electrically connected with the grounding end of the first circuit layer.

In order to achieve the above object, a method of manufacturing a chip package having at least one electromagnetic interference (EMI) shielding layer and at least one ground wire according to the present invention includes the following steps.

Step 1: providing a chip package which includes a substrate, at least one first circuit layer, at least one chip, and a first insulating layer. The first circuit layer is provided with at least one grounding end and the chip is electrically connected with and arranged at the first circuit layer of the substrate. The first insulating layer which is provided with a first surface is disposed on the substrate and covering the chip.

Step 2: covering the first surface of the first insulating layer completely with at least one EMI shielding layer which is made of metal materials;

Step 3: forming at least one blind hole on both the EMI shielding layer and the first insulating layer by drilling at the same time while the blind hole of the EMI shielding layer and the blind hole of the first insulating layer are communicating with each other and the blind hole of the first insulating layer is aligned and communicating with the grounding end of the first circuit layer;

Step 4: arranging at least one ground wire at the blind hole of the EMI shielding layer and the blind hole of the first insulating layer respectively while the ground wire is provided with a first end and a second end opposite to each other; the first end of the ground wire is electrically connected with the EMI shielding layer while the second end of the ground wire is electrically connected with the grounding end of the first circuit layer; thereby production of the chip package is completed.

DETAILED DESCRIPTION OF THE PREFERRED EMBODIMENT

Figure 1:
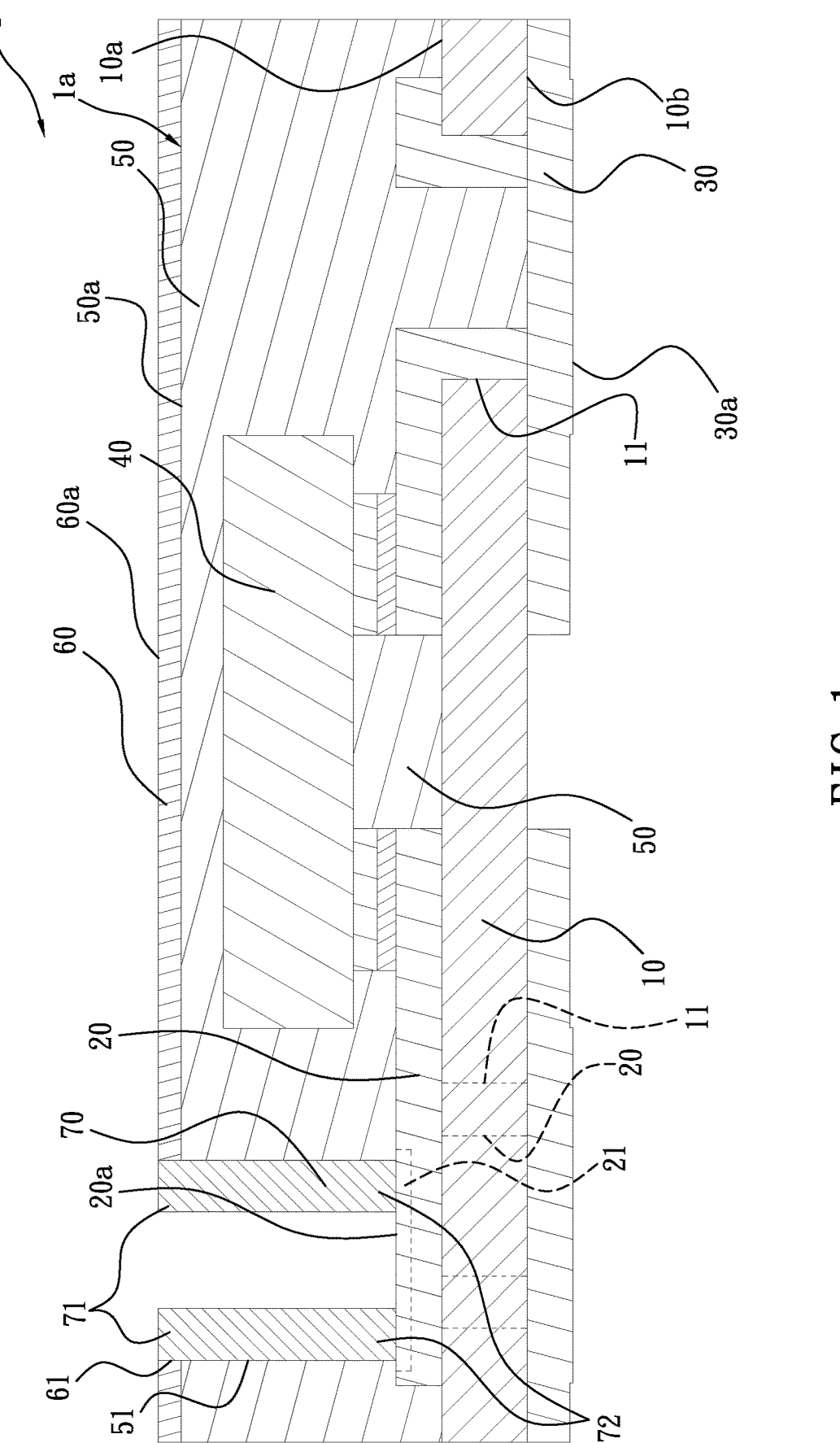
FIG. 1 is a side view of a section of a first embodiment of a chip package according to the present invention.
Figure 10:
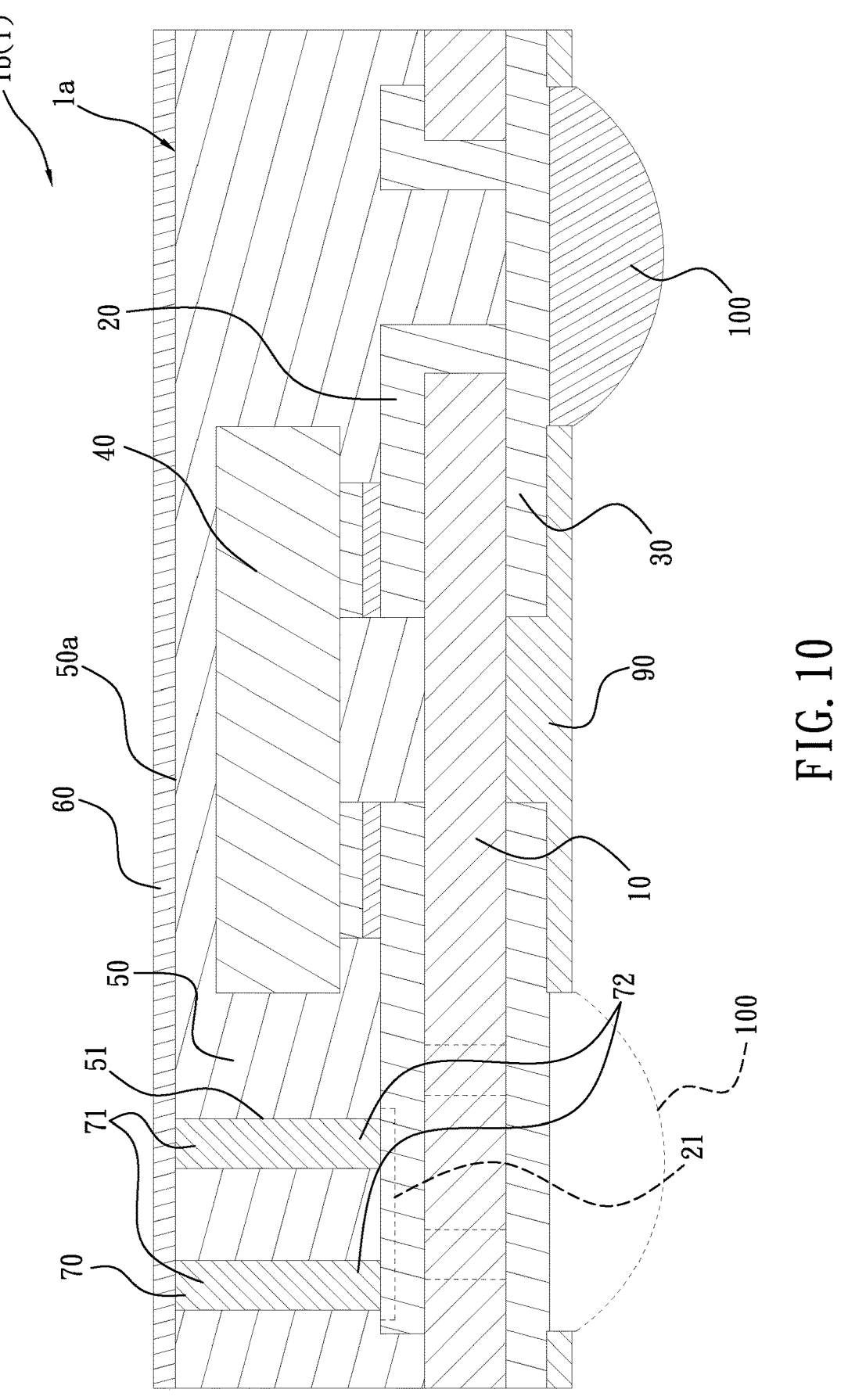
FIG. 10 is a side view of a section of a second embodiment of a chip package according to the present invention;6
Figure 11:
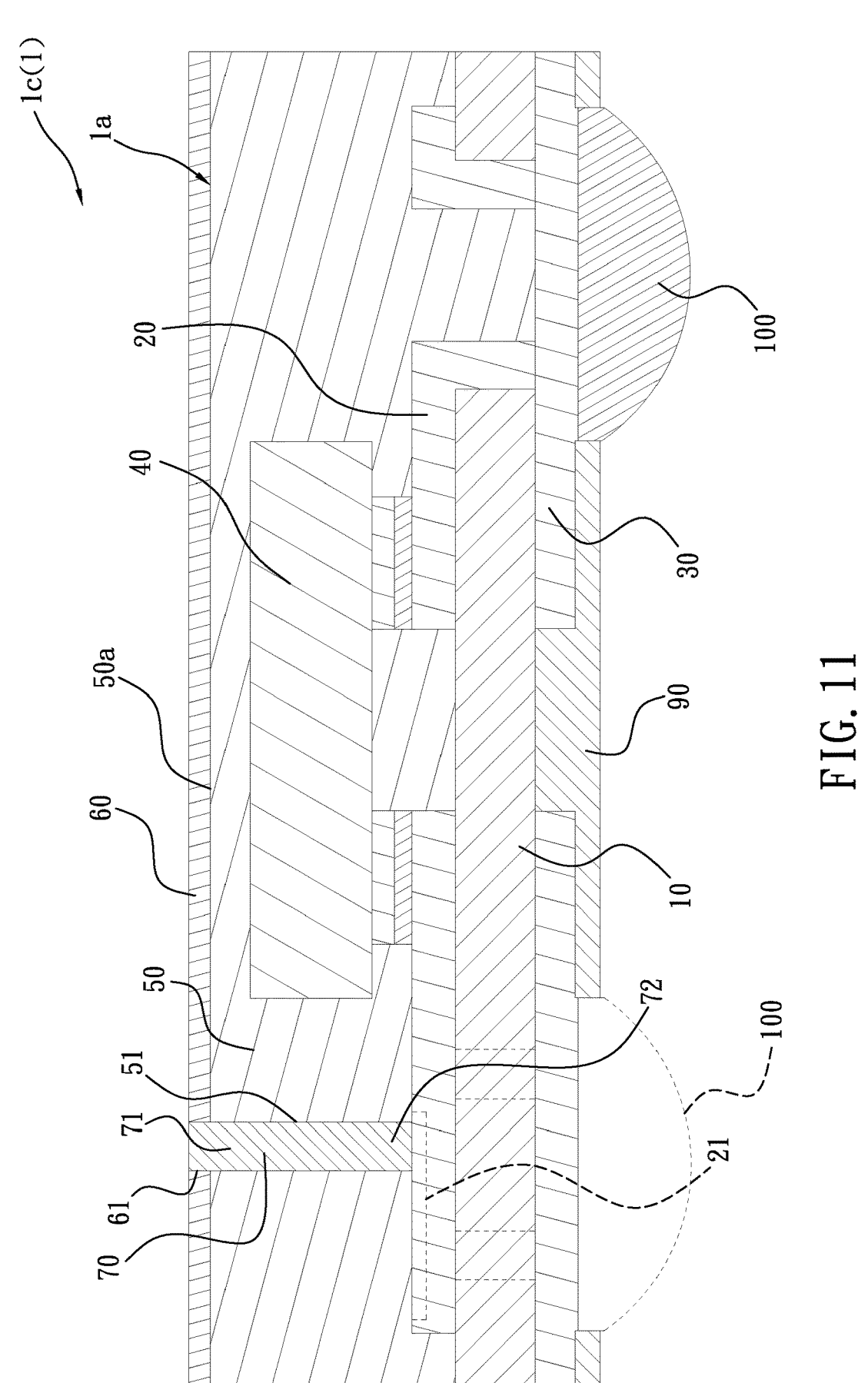
FIG. 11 is a side view of a section of a third embodiment of a chip package according to the present invention.

Refer to FIG. 1, FIG. 10, and FIG. 11, a chip package 1, 1b, 1c according to the present invention includes a chip package unit 1a, at least one electromagnetic interference (EMI) shielding layer 60, and at least one ground wire 70.

Figure 4:
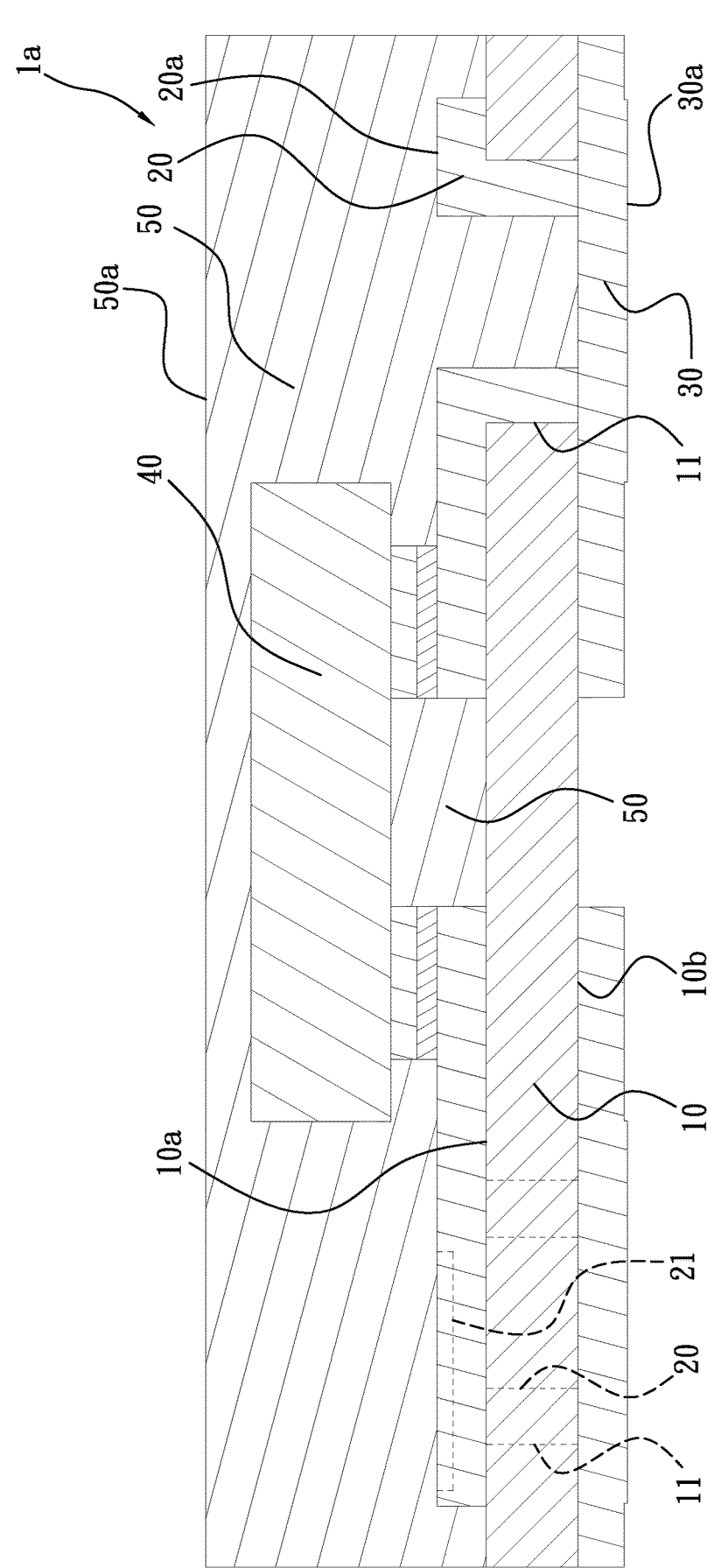
FIG. 4 is a side view of a section of a chip package unit of an embodiment according to the present invention.

The chip package unit 1a consists of a substrate 10, at least one first circuit layer 20, at least one chip 40, and a first insulating layer 50, as shown in FIG. 4. The first circuit layer 20 is provided with at least one grounding end 21 and the chip 40 is electrically connected with and arranged at the first circuit layer 20 of the substrate 10. The first insulating layer 50 which is provided with a first surface 50a is disposed on the substrate 10 and covering the chip 40.

Figure 5:
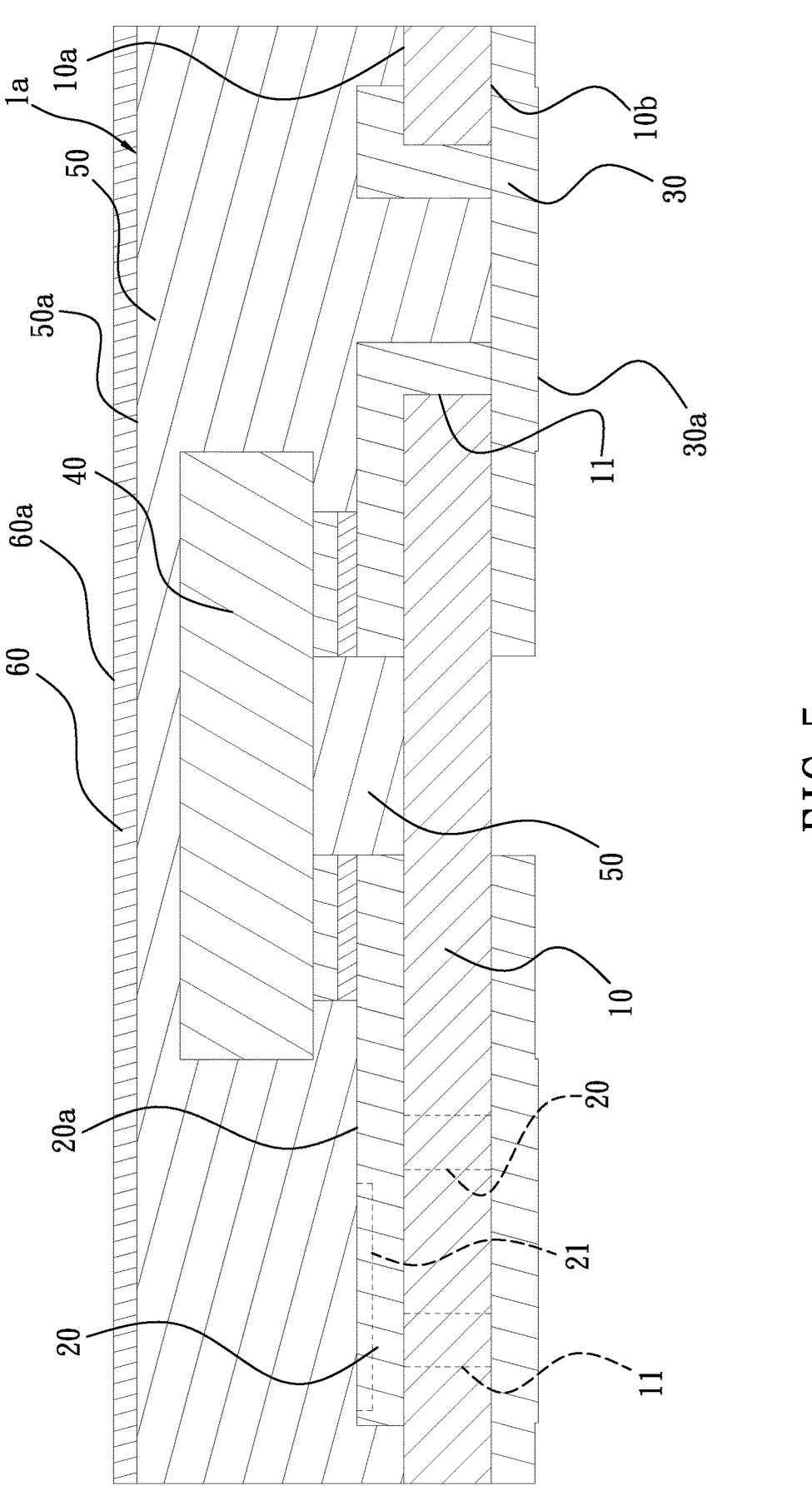
FIG. 5 is a schematic drawing showing a first surface of a first insulating layer of the embodiment in FIG. 4 is provided with an electromagnetic interference (EMI) shielding layer according to the present invention.

The EMI shielding layer 60 made of metals is covering and disposed on the first surface 50a of the first insulating layer 50 for protecting the chip package unit 1a from electromagnetic interference (EMI), as shown in FIG. 5.

Figure 3:
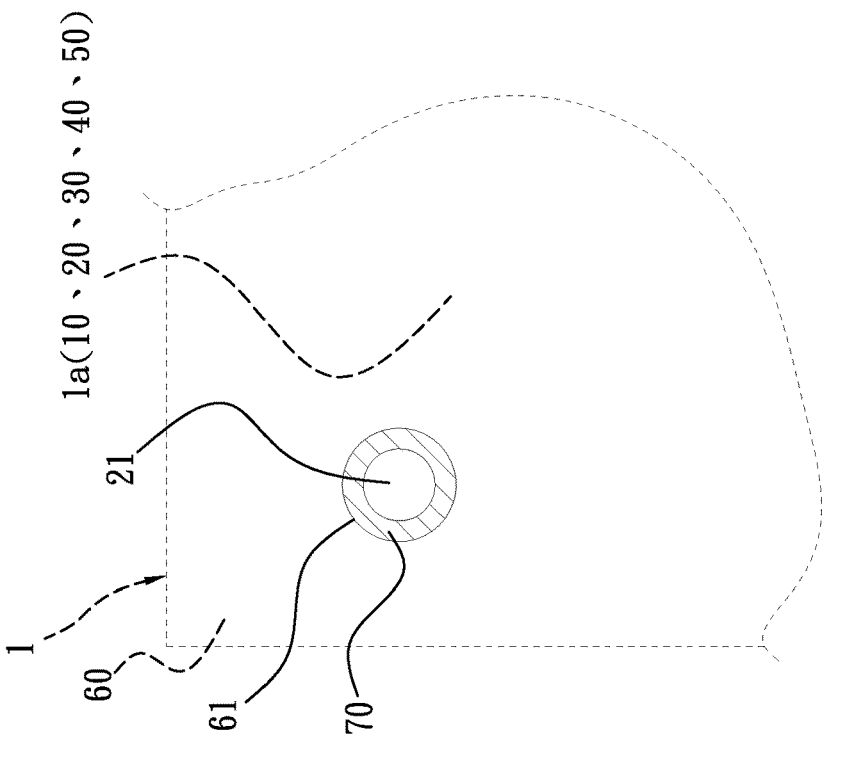
FIG. 3 is a partial enlarged view of the embodiment in FIG. 2 according to the present invention.
Figure 2:
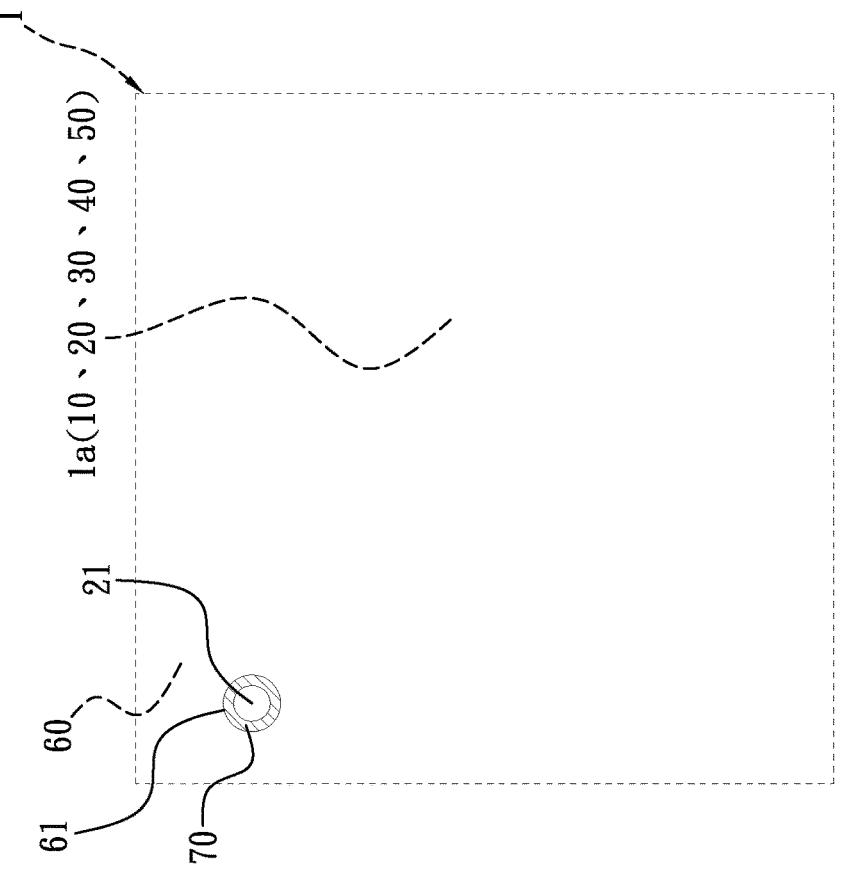
FIG. 2 is a top view of a first embodiment of a chip package according to the present invention.

Refer to FIG. 1-3, the ground wire 70 is inserted through the EMI shielding layer 60 and the first insulating layer 50 and provided with a first end 71 and a second end 72 opposite to the first end 71. The first end 71 of the ground wire 70 is electrically connected with the EMI shielding layer 60 while the second end 72 of the ground wire 70 is electrically connected with the grounding end 21 of the first circuit layer 20.

According to different ways the ground wire 70 being arranged in the respective chip packages 1, 1b, 1c, a first embodiment (the chip package 1), a second embodiment (the chip package 1b), and a third embodiment (the chip package 1c) of the present invention are provided.

As shown in FIG. 1-6, a method of manufacturing the first embodiment (the chip package 1) of the present invention includes the following steps.

Step 1: providing a chip package 1a; the chip package 1a includes a substrate 10, at least one first circuit layer 20, at least one chip 40, and a first insulating layer 50, as shown in FIG. 4. The first circuit layer 20 is provided with at least one grounding end 21 and the chip 40 is electrically connected with and arranged at the first circuit layer 20 of the substrate 10. The first insulating layer 50 which is provided with a first surface 50a is disposed on the substrate 10 and covering the chip 40.

Step 2: covering the first surface 50a of the first insulating layer 50 completely with at least one EMI shielding layer 60, as shown in FIG. 5. The EMI shielding layer 60 is formed by metal materials.

Figure 6:
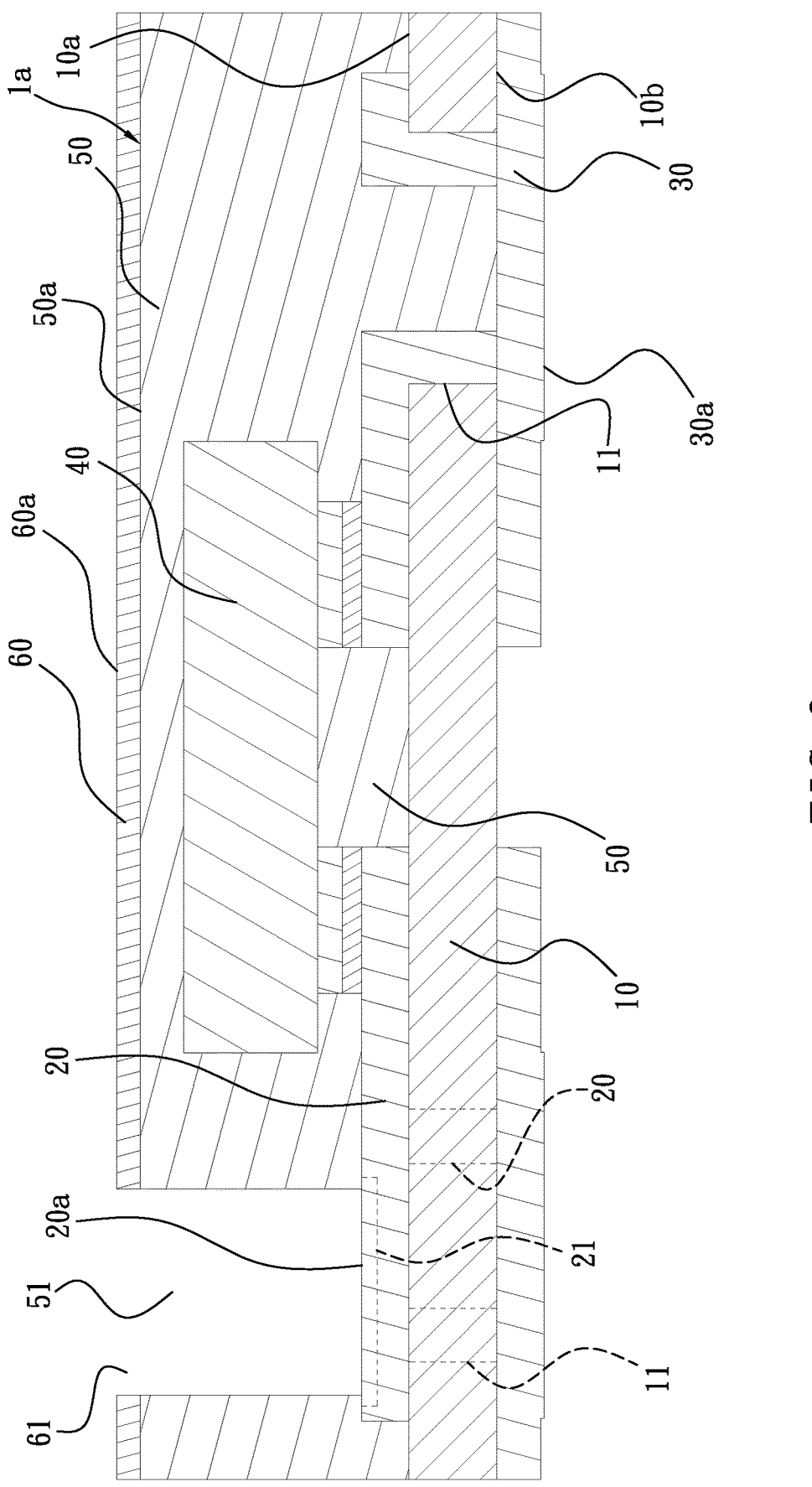
FIG. 6 is a schematic drawing showing a blind hole formed on an EMI shielding layer and a first insulating layer by drilling of an embodiment according to the present invention.

Step 3: forming at least one blind hole 61, 51 on both the EMI shielding layer 60 and the first insulating layer 50 correspondingly by drilling at the same time, as shown in FIG. 6. The blind hole 61 of the EMI shielding layer 60 and the blind hole 51 of the first insulating layer 50 are communicating with each other while the blind hole 51 of the first insulating layer 50 is aligned and communicating with the grounding end 21 of the first circuit layer 20, as shown in FIG. 2, FIG. 3, and FIG. 6.

Step 4: arranging at least one ground wire 70 at the blind hole 61 of the EMI shielding layer 60 and the blind hole 51 of the first insulating layer 50 respectively, as shown in FIG. 1-3. The ground wire 70 is provided with a first end 71 and a second end 72 opposite to the first end 71. The first end 71 is electrically connected with the EMI shielding layer 60 while the second end 72 is electrically connected with the grounding end 21 of the first circuit layer 20. Thereby manufacturing of the chip package 1 is completed, as shown in FIG. 1-3.

Both the blind hole 61 of the EMI shielding layer 60 and the blind hole 51 of the first insulating layer 50 are not filled fully with the ground wire 70. In fact, the ground wire 70 is wound and arranged circularly at a surface of an inner wall of the blind hole 61 of the EMI shielding layer 60 and the blind hole 51 of the first insulating layer 50, as shown in FIG. 2 and FIG. 3.

Refer to FIG. 10, a second embodiment of a chip package 1b is provided. A method of manufacturing the chip package 1b (the second embodiment) is different from that of the chip package 1 (the first embodiment). First the blinds hole 51 is formed on the first insulating layer 50 of the chip package unit 1a by drilling in the second embodiment (the chip package 1b). Then the first insulating layer 50 is completely covered with the EMI shielding layer 60. Lastly the ground wire 70 is formed on the blind hole 51 of the first insulating layer 50 by physical vapor deposition (PVD). Thereby a chip package 1b is formed, as shown in FIG. 10.

Refer to FIG. 11, a third embodiment of a chip package 1c is provided. A method of manufacturing the chip package 1c (the third embodiment) is different from that of the chip package 1 (the first embodiment). First both the blind hole 61 of the EMI shielding layer 60 and the blind hole 51 of the first insulating layer 50 are fully filled with the ground wire 70 of the chip package 1c. And a diameter of both the blind hole 61 of the EMI shielding layer 60 and the blind hole 51 of the first insulating layer 50 of the chip package 1c is smaller than a diameter of both the blind hole 61 of the EMI shielding layer 60 and the blind hole 51 of the first insulating layer 50 of the chip package 1, as shown in FIG. 1 and FIG. 11.

Refer to FIG. 1, the chip package unit 1a further includes at least one second circuit layer 30. The substrate 10 is provided a first surface 10a and a second surface 10b opposite to the first surface 10a. At least one blind hole 11 is formed on the first surface 10a of the substrate 10, as shown in FIG. 1. The first circuit layer 20 is arranged at the first surface 10a of the substrate 10 and extending to a surface of an inner wall of the blind hole 11 of the substrate 10. The first circuit layer 20 is provided with a first surface 20a on which the grounding end 21 is disposed. The second circuit layer 30 is arranged at the second surface 10b of the substrate 10. The first circuit layer 20 is extending along the blind hole 11 of the substrate 10 to be electrically connected with the second circuit layer 30. The chip 40 is further disposed on the first surface 20a of the first circuit layer 20. The chip 40 is first electrically connected with the first surface 20a of the first circuit layer 20 and then extending to the second circuit layer 30 by the first circuit layer 20 along the surface of the inner wall of the blind hole 11 of the substrate 10. Thereby the chip 40 can be electrically connected with the outside by the second circuit layer 30. The first insulating layer 50 is provided with at least one blind hole 51 which is aligned and communicating with the grounding end 21 of the first circuit layer 20, as shown in FIG. 1. As to the EMI shielding layer 60, it is used for preventing the first circuit layer 20, the second circuit layer 30, and the chip from electromagnetic interference (EMI) and provided with at least one blind hole 61 which is communicating with the blind hole 51 of the first insulating layer 50, as shown in FIG. 1. The ground wire 70 is arranged at the surface of the inner wall of both the blind hole 61 of the EMI shielding layer 60 and the blind hole 51 of the first insulating layer 50.

Figure 7:
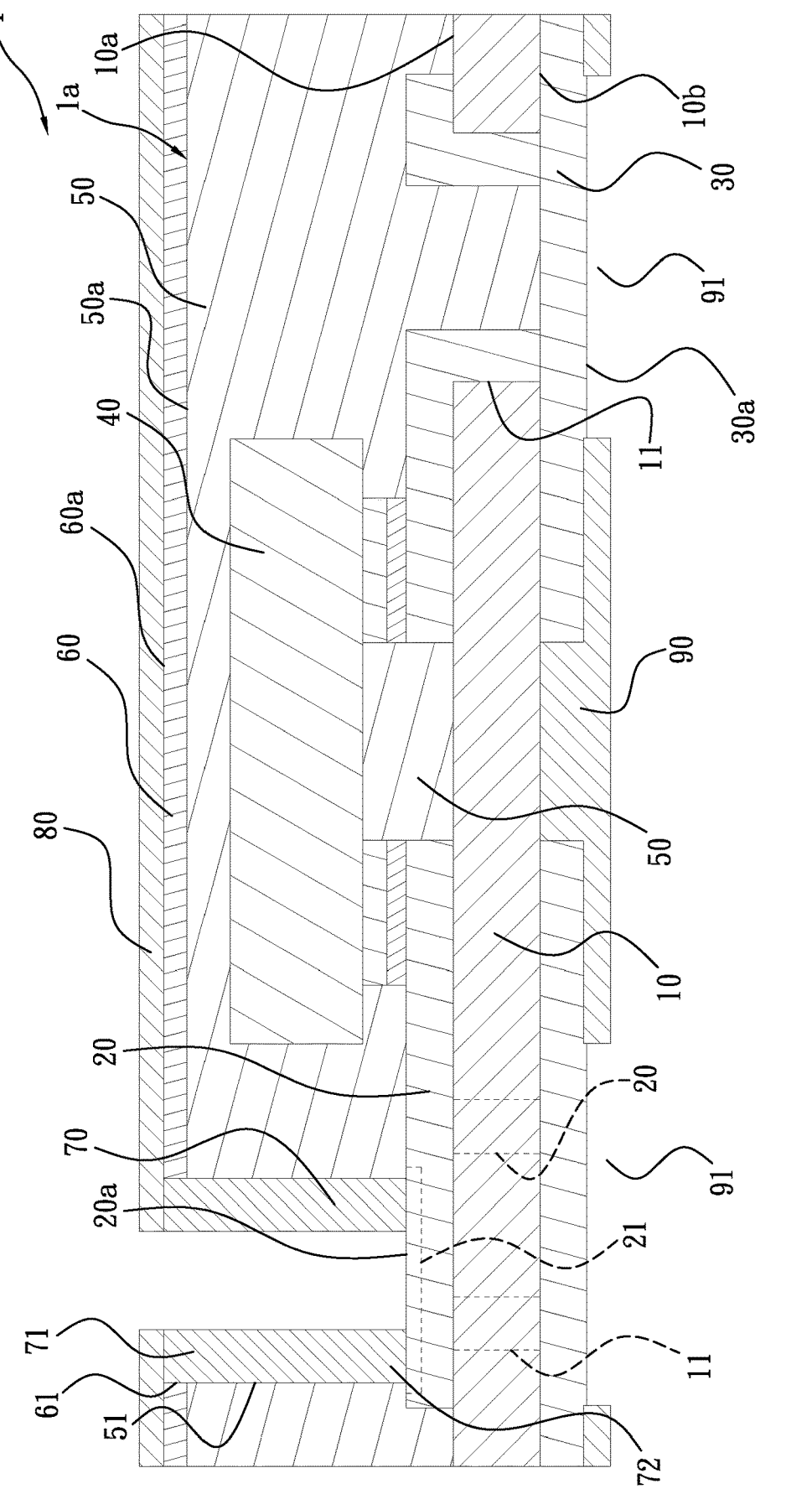
FIG. 7 is a schematic drawing showing the chip package of first the embodiment in FIG. 1 provided with a first outer protective layer and a second protective layer according to the present invention.

Refer to FIG. 7, the second circuit layer 30 further includes a first surface 30a while the EMI shielding layer 60 is further provided with a first surface 60a. The chip package 1 further includes at least one first outer protective layer 80 and at least one second outer protective layer 90 respectively disposed on the first surface 60a of the EMI shielding layer 60 and the first surface 30a of the second circuit layer 30 correspondingly. The second outer protective layer 90 is provided with at least one opening 91 which is used for allowing the first surface 30a of the second circuit layer 30 to be exposed, as shown in FIG. 7.

Figure 8:
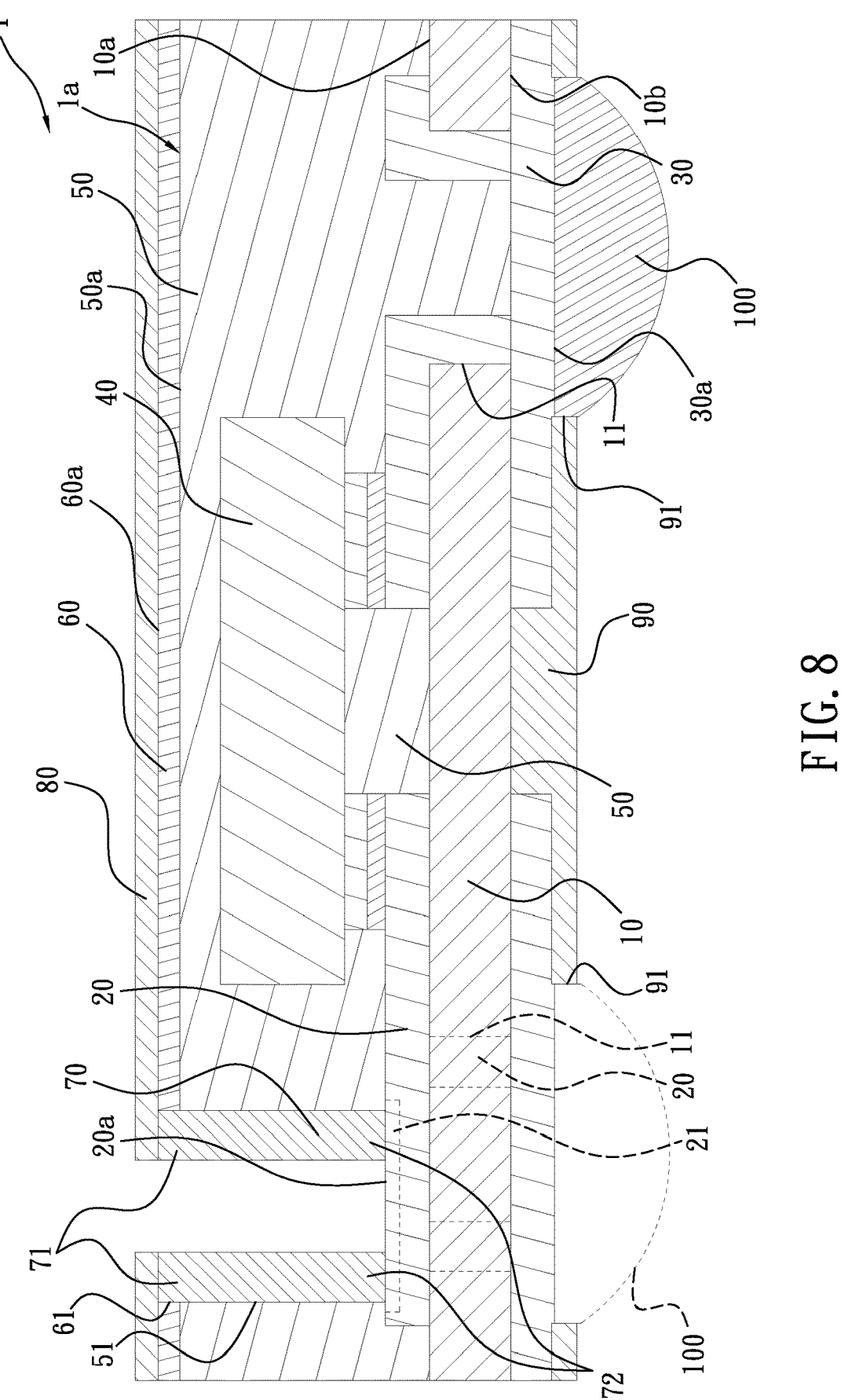
FIG. 8 is a schematic drawing showing the embodiment in FIG. 7 in which a solder ball is disposed on an opening of a second outer protective layer according to the present invention.

Refer to FIG. 8, the opening 91 of the second outer protective layer 90 is provided with a solder ball 100 which is electrically connected with the first surface 30a of the second circuit layer 30. Thereby the chip 40 is electrically connected with the outside by the solder ball 100, as shown in FIG. 8. Moreover, the chip package 1 can be electrically connected with a circuit board 2 by the solder ball 100, as shown in FIG. 9.

Figure 9:
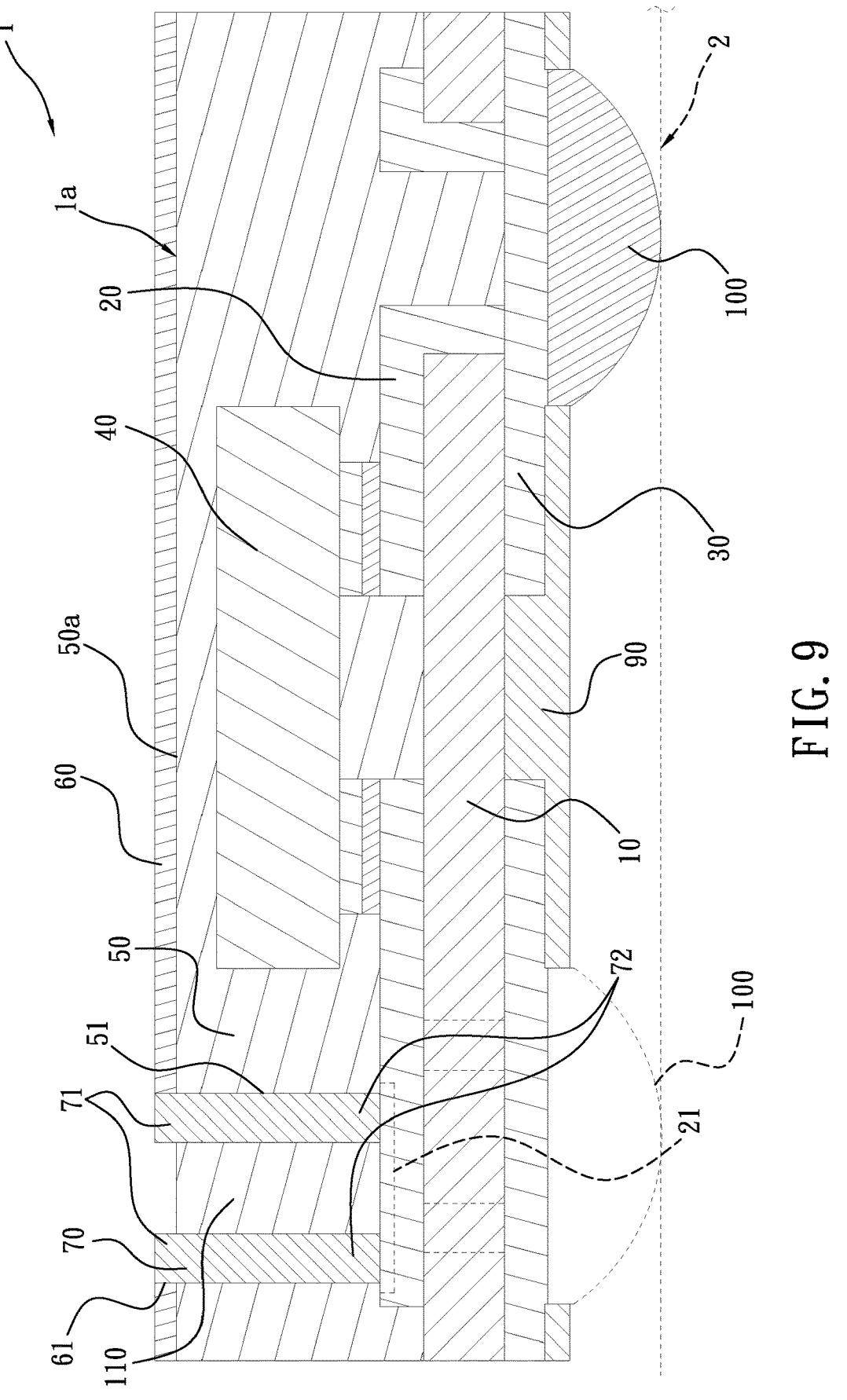
FIG. 9 is a schematic drawing showing the chip package of the embodiment in FIG. 1 is provided with a second insulating layer according to the present invention.

Refer to FIG. 9, the chip package 1 further includes a second insulating layer 110 which is fully filled in the blind hole 51 of the first insulating layer 50. A level of the second insulating layer 110 is the same as a level of the first insulating layer 50.

Refer to FIG. 5, the EMI shielding layer 60 is disposed on the first surface 50a of the first insulating layer 50 by pressing. The EMI shielding layer 60 is made of copper, but not limited.

The chip packages 1, 1b, and 1c according to the present invention have the following advantages.

1. The ground wire 70 of the present invention is inserted through the EMI shielding layer 60 and the first insulating layer 50 of the chip package unit 1a. The ground wire 70 is provided with the first end 71 and the second end 72 opposite to each other and respectively electrically connected with the EMI shielding layer 60 and the grounding end 21 of the first circuit layer 20 of the chip package unit 1a for protection against static electricity effectively.

2. The EMI shielding layer 60 of the present invention is made of metals and covering the first surface 50a of the first insulating layer 50 for protecting the chip package unit 1a from electromagnetic interference (EMI).

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

The invention claimed is:

1. A chip package with at least one electromagnetic interference (EMI) shielding layer and at least one ground wire comprising:

a chip package unit which includes a substrate, at least one first circuit layer, at least one chip, and a first insulating layer; wherein the at least one first circuit layer is provided with at least one grounding end; wherein the at least one chip is electrically connected with and arranged at the at least one first circuit layer of the substrate; wherein the first insulating layer which is provided with a first surface is disposed on the substrate and covering the at least one chip;

at least one electromagnetic interference (EMI) shielding layer made of metal and disposed on and covering the first surface of the first insulating layer for protecting the chip package unit from electromagnetic interference (EMI); and at least one ground wire is inserted through the at least one EMI shielding layer and the first insulating layer and provided with a first end and a second end opposite to the first end; wherein the first end of the at least one ground wire is electrically connected with the at least one EMI shielding layer; wherein the second end of the at least one ground wire is electrically connected with the at least one grounding end of the at least one first circuit layer.

2. The chip package as claimed in claim 1, wherein the chip package unit further includes at least one second circuit layer; wherein the substrate includes a first surface and a second surface opposite to each other while at least one blind hole is formed on the first surface of the substrate; wherein the at least one first circuit layer is arranged at the first surface of the substrate and extending to a surface of an inner wall of the at least one blind hole of the substrate; wherein the at least one first circuit layer is provided with a first surface on which the at least one grounding end is disposed; wherein the at least one second circuit layer is arranged at the second surface of the substrate; wherein the at least one first circuit layer is extending through the at least one blind hole of the substrate and electrically connected with the at least one second circuit layer; wherein the at least one chip is further disposed on the first surface of the at least one first circuit layer; wherein the at least one chip is first electrically connected with the first surface of the at least one first circuit layer and then extending to the at least one second circuit layer by the at least one first circuit layer along the surface of the inner wall of the at least one blind hole of the substrate so that the at least one chip is electrically connected with the outside by the at least one second circuit layer; wherein the first insulating layer is provided with the at least one blind hole which is aligned and communicating with the at least one grounding end of the at least one first circuit layer; wherein the at least one EMI shielding layer is used for protecting the at least one first circuit layer, the at least one second circuit layer, and the at least one chip from the electromagnetic interference; wherein the at least one EMI shielding layer is provided with the at least one blind hole which is communicating with the at least one blind hole of the first insulating layer; wherein the at least one ground wire is disposed on a surface of an inner wall of the at least one blind hole of the at least one EMI shielding layer and a surface of an inner wall of the at least one blind hole of the first insulating layer.

3. The chip package as claimed in claim 2, wherein the at least one second circuit layer further includes a first surface; wherein the at least one EMI shielding layer is further provided with a first surface; wherein the chip package further includes at least one first outer protective layer and at least one second outer protective layer respectively disposed on the first surface of the at least one EMI shielding layer and the first surface of the at least one second circuit layer correspondingly; the at least one second outer protective layer is provided with at least one opening which is used for allowing the first surface of the at least one second circuit layer to be exposed.

4. The chip package as claimed in claim 3, wherein the at least one opening of the at least one second outer protective layer is provided with a solder ball which is electrically connected with the first surface of the at least one second circuit layer; thereby the at least one chip is electrically connected with the outside by the solder ball.

5. The chip package as claimed in claim 2, wherein the chip package further includes a second insulating layer; wherein the second insulating layer is fully filled in the at least one blind hole of the first insulating layer while a level of the second insulating layer is the same as a level of the first insulating layer.

6. The chip package as claimed in claim 1, wherein the at least one EMI shielding layer is disposed on the first surface of the first insulating layer by pressing.

7. The chip package as claimed in claim 1, wherein the at least one EMI shielding layer is made of copper.

8. A method of manufacturing a chip package having at least one electromagnetic interference (EMI) shielding layer and at least one ground wire comprising the steps of:

Step 1: providing a chip package which includes a substrate, at least one first circuit layer, at least one chip, and a first insulating layer; wherein the at least one first circuit layer is provided with at least one grounding end and the at least one chip is electrically connected with and arranged at the at least one first circuit layer of the substrate; wherein the first insulating layer which is provided with a first surface is disposed on the substrate and covering the at least one chip;

Step 2: covering the first surface of the first insulating layer completely with the at least one EMI shielding layer; wherein the at least one EMI shielding layer is made of metal;

Step 3: forming at least one blind hole on both the at least one EMI shielding layer and the first insulating layer by drilling at the same time; wherein the at least one blind hole of the at least one EMI shielding layer and the at least one blind hole of the first insulating layer are communicating with each other while the at least one blind hole of the first insulating layer is aligned and communicating with the at least one grounding end of the at least one first circuit layer; and Step 4: arranging the at least one ground wire at the at least one blind hole of the at least one EMI shielding layer and the at least one blind hole of the first insulating layer respectively;

wherein the at least one ground wire is provided with a first end and a second end opposite to each other; the first end of the at least one ground wire is electrically connected with the at least one EMI shielding layer while the second end of the at least one ground wire is electrically connected with the at least one grounding end of the at least one first circuit layer; thereby manufacturing of the chip package is completed.

* * * * *